United States Patent [19]

Wakumura et al.

[11] Patent Number: 4,897,653
[45] Date of Patent: Jan. 30, 1990

[54] DATA OUTPUTTING CIRCUIT

[75] Inventors: Shin-ichi Wakumura; Ichiro Miyake, both of Saitama; Hiroo Okamoto; Yuuji Hatanaka, both of Kanagawa, all of Japan

[73] Assignees: Pioneer Electronic Corporation; Hitachi Ltd., both of Toyko, Japan

[21] Appl. No.: 234,862

[22] Filed: Aug. 22, 1988

[30] Foreign Application Priority Data

Aug. 20, 1987 [JP] Japan .................. 62-205042

[51] Int. Cl.[4] .................................. H03M 7/20
[52] U.S. Cl. ............................. 341/95; 341/102
[58] Field of Search .................. 341/72, 95, 100, 102

[56] References Cited
U.S. PATENT DOCUMENTS 4,682,152 7/1987 Okamoto et al. .................. 341/95
4,728,929 3/1988 Tanaka ................................. 341/95

Primary Examiner—William M. Shoop, Jr.
Assistant Examiner—Gary J. Romano
Attorney, Agent, or Firm—Sughrue, Mion, Zinn, Macpeak & Seas

[57] ABSTRACT

A data outputting circuit including absolute value conversion circuit for converting digital data that is inputted with a determined sampling period into absolute value data, a register for storing the largest of the absolute value data provided within a predetermined period of time, a transferring register for receiving data and trransferring the data every predetermined period of time, and a compressing circuit adapted to compress compressing the data applied to the transferring register, whereby the circuit scale is reduced, and the data transferring time or the number of transferring lines is decreased.

8 Claims, 4 Drawing Sheets

FIG. 3
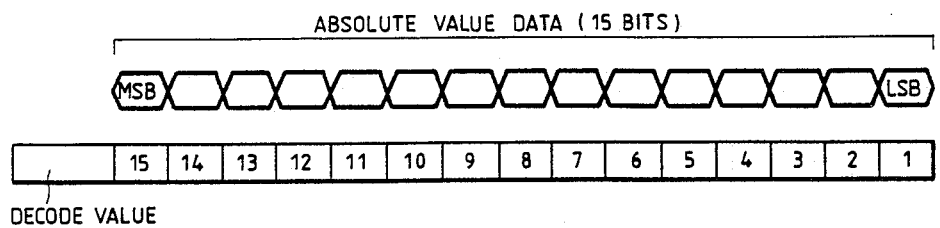
FIG. 4
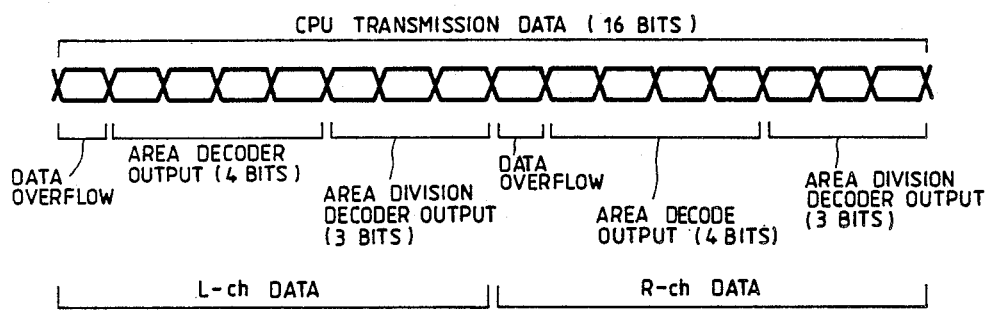
FIG. 5
| AREA DIVISION DECODER OUTPUT | | | D |
|---|---|---|---|
| 1 | 1 | 1 | 0 |
| 1 | 1 | 0 | 1 |
| 1 | 0 | 1 | 2 |
| 1 | 0 | 0 | 2 |
| 0 | 1 | 1 | 3 |
| 0 | 1 | 0 | 4 |
| 0 | 0 | 1 | 5 |
| 0 | 0 | 0 | 6 |

DATA OUTPUTTING CIRCUIT

BACKGROUND OF THE INVENTION

This invention relates to a circuit for outputting data to a digital level display unit in order to monitor a PCM level in a PCM recording and reproducing device or PCM reproducing device.

One example of a conventional digital level display unit for monitoring a PCM level, as shown in FIG. 8, comprises: a signal input terminal 1 to which a 16-bit PCM signal is applied; an absolute value conversion section 2 for converting the 16-bit PCM signal applied to the signal input terminal 1 into 15-bit absolute value data by ABSOLUTE-ORing the MSB (most significant bit) of the PCM signal and other bits; a peak latch section 3 for retaining the maximum value of the output data from the absolute value conversion section 2, the peak latch section 3 having a comparator 3a, a L-ch (left channel) register 3b, and a R-ch (right channel) register 3c; a data transferring register 4 for serially transferring 30-bit parallel data consisting of 15-bit peak data for left-channel and 15-bit peak data for right-channel; a CPU 5 operating according to a predetermined control program to perform, for instance, the logarithmic conversion of peak data, a display decoding operation for display, and a display driving operation; and a level display device 6 which is driven according to the result of the display decoding operation of the CPU 5.

In the digital level display unit thus organized, a 16-bit PCM signal applied to the signal input terminal 1 is converted into 15-bit absolute value data by the absolute value conversion section 2, the output of which is applied to the peak latch section 3. When the data applied to the peak latch section 3 is L-ch data, the peak latch section 3 causes the comparator 3a to compare the input data with the data which has been stored in the L-ch register 3b. When the input data is larger, the input data is stored in the L-ch register 3b. In the case where the maximum value data stored in the R-ch register 3c and the L-ch register 3b are applied to the CPU 5, first the data are transferred from the registers 3b and 3c to the data transferring register 4, and then the registers 3b and 3c are cleared by a clear signal. Next, the CPU 5 applies a data transferring clock signal to the data transferring register 4 so that the R-ch and L-ch maximum value data are applied, in a serial mode, to the CPU 5.

The CPU 5 uses the data provided by the data transferring register, to perform a logarithmic conversion operation according to the following equation (1) in which for the full scale data, 0 dB is selected; i.e., for the absolute value data the 15 bits of which are all "1", 0 dB is selected:

$$X = 20 \log \left( \frac{\text{maximum value data}}{\text{full scale data}} \right)$$

$$= 20 \log \frac{(\text{maximum value data}) \text{ decimal}}{32767}$$

In order to turn on the display elements of the level display device 6, the CPU 5 decodes the data X obtained through the logarithmic conversion, to drive the level display device 6.

As is apparent rom the above description, the conventional circuit is disadvantageous in the following points: since the peak latch section 3 must process the data for every 15 bits, the scale of the circuit is unavoidably large. Furthermore, transferring the data to the CPU in a serial mode takes a relatively long period of time and requires multiple data lines. In addition, the CPU for processing the data must perform intricate arithmetic operations such as the above-described equation (1). Thus, the burden on the software is considerably large.

SUMMARY OF THE INVENTION

Accordingly, an object of this invention is to eliminate the above-described difficulties accompanying a conventional digital level display unit.

More specifically, an object of the present invention is to provide a data outputting circuit which can reduce the circuit scale, can output data in a shorter period of time or with fewer data lines, and can relieve the data processing burden on the data receiving side.

The foregoing objects and other objects of the invention have been achieved by the provision of a data outputting circuit comprising: absolute value conversion means for converting digital data which has been successively input with a predetermined sampling period into absolute value data; register means for storing the largest of the absolute value data provided by the absolute value conversion means within a predetermined period of time; and transferring register means for receiving data and transferring the data every predetermined period of time, and compressing means for compressing data into data with fewer bits, the compressing means compressing the data applied to the transferring register means.

The nature, principle and utility of the invention will become more apparent from the following detailed description when read in conjunction with the accompanying drawings.

BRIEF DESCRIPTION OF THE DRAWINGS

In the accompanying drawings:

FIG. 3 is an explanatory diagram for a description of a method of giving decoded values corresponding to absolute value data;

FIG. 4 is an explanatory diagram showing a data transferring format for a CPU;

FIG. 5 is an explanatory diagram showing the conversion table of an area division decoder output;

DETAILED DESCRIPTION OF THE INVENTION

Preferred embodiments of this invention will be described with reference to the accompanying drawings.

Figure 1:
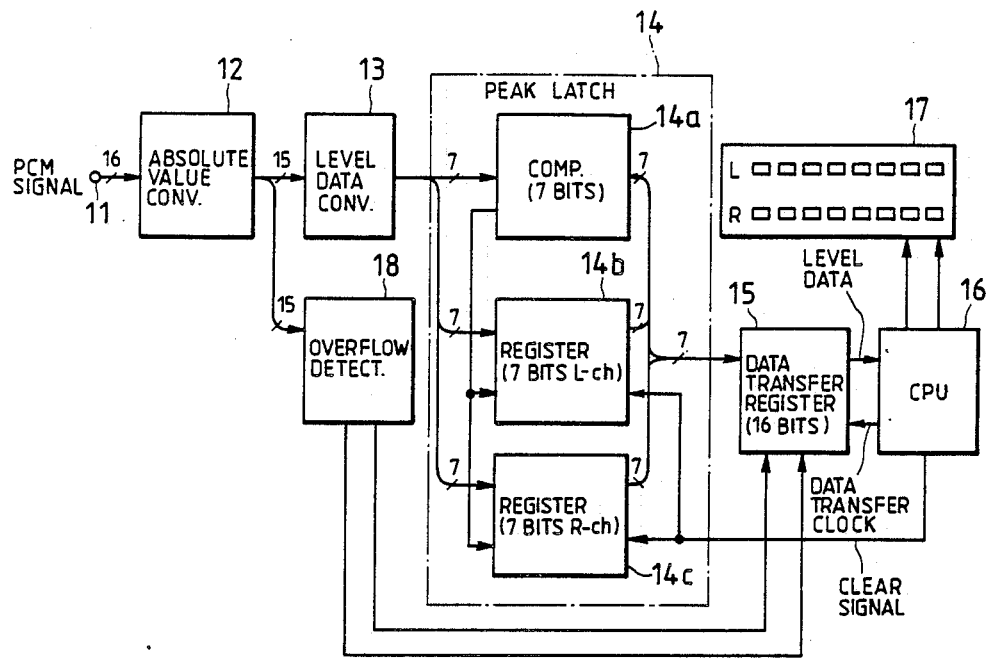
FIG. 1 is a block diagram showing one example of a digital level display unit to which a data outputting circuit of this invention is applied.

One example of a digital level display unit to which a data outputting circuit according to the invention is applied is as shown in FIG. 1. The digital level display unit comprises: a signal input terminal 11 to which a 16-bit PCM signal represented by 2's complement is applied; an absolute value conversion section 12 for converting the 16-bit PCM signal into 15-bit absolute value data by EXCLUSIVE ORing of the MSB (most significant bit) of the PCM signal and other bits; a level data conversion section 13 for converting 15-bit absolute value data into 7-bit data for logarithmic approximation; and a peak latch section 14 for retaining maximum level data values, these forming compression means for compressing absolute value data into data with fewer bits than the number of bits of the absolute value data which is then outputted, and register means for storing the largest of the data outputted by the compression means. The peak latch section 14 comprises: a comparator 14a, L-ch (left channel) register 14b, and R-ch (right channel) register 14c.

The digital level display unit further comprises: a data transferring register 15 for transferring in a serial mode 16-bit parallel data consisting of a 7-bit level data maximum value and 1-bit overflow data for R-ch and a 7-bit data maximum value and 1-bit overflow data for L-ch; a CPU 16 operating according to a predetermined control program, to perform logarithmic approximation of a level data maximum value, a display decoding operation for display, and a display driving operation; a level display device 17 which is driven by the CPU 16 according to the result of the display decoding operation; and an overflow detecting section 18 for detected when all the bits of absolute value data are "1".

Figure 2:
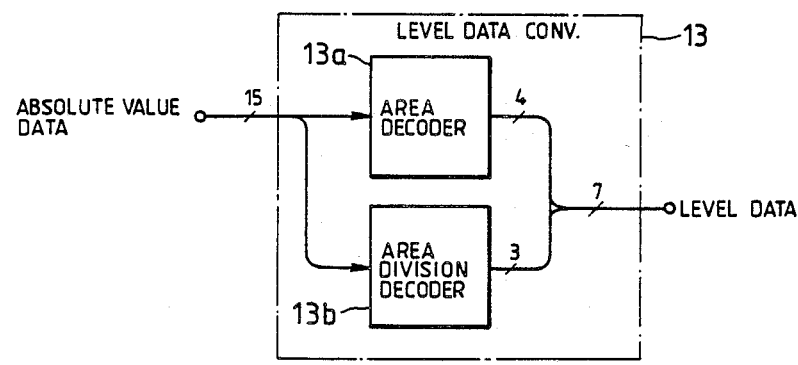
FIG. 2 is a block diagram showing a level data conversion section in the digital level display unit of FIG. 1.

The level data conversion section 13 is shown in FIG. 2 in more detail. That is, the level data conversion section 13 comprises: an area decoder 13a and an area division decoder 13b, both of which receive 15-bit absolute value data. The level data conversion section 13 outputs 7-bit level, data consisting of the 4-bit output of the area decoder 13a and the 3-bit output of the area division decoder 13b.

In the digital level display unit thus organized, a 16-bit PCM signal applied to the signal input terminal 11 is converted into 15-bit absolute value data by the absolute value conversion section 12, the output of which is applied to the level data conversion section 13 and the overflow detecting section 18. In the level data conversion section 13, the area decoder 13a (FIG. 2) gives decoded values to all of the fifteen (15) bits of the absolute value data as shown in FIG. 3, and outputs the decoded value of the bit in which "1" first appears starting with the MSB in the form of 4-bit binary data. On the other hand, the area division decoder 13b (FIG. 2) outputs, as it is, 3-bit data from the bit next to the bit where "1" first appears starting with MSB. However, in the case where 3-bit data is not available from the bit next to the bit where "1" first appears, the missing bits are outputted as "0". The absolute value data applied to the level data conversion section 13 is converted into 7-bit level data in the above-described manner, and the 7-bit level data is applied to the peak latch section 14.

When the level data applied to the peak latch section 14 is L-ch data, the comparator 14a compares the data with the data which has been stored in the L-ch register 14b. If the input level data is larger, it is stored in the L-ch register 14b in place of the previously stored data.

In the case where the CPU 16 reads the maximum value data from the L-ch register 14b and the R-ch register 14c, first the data are transferred from the registers 14b and 14c to the data transferring register 15, and then the registers 14b and 14c are cleared by a clear signal from the CPU 16. The data transferring register 15 also receives R-ch and L-ch overflow data from the overflow detecting section 18. Next, the CPU 16 applies a data transferring clock signal to the data transferring register 15, to read the R-ch and L-ch maximum value data and overflow data. The data transfer format in this operation is as shown in FIG. 4.

After reading the data, the CPU 16 performs a logarithmic approximation thereof according to the following equation (2), decodes the data Y obtained through the logarithmic approximation for display, and drives the display elements of the level display device 17 according to the result of the data decoding operation:

$$Y = B \times 6 - D - 90 \tag{2}$$

where B is the area decoder output having a value ranged from 1 to 15, and D is the 3-bit output of the area division decoder which has been converted according to a conversion table shown in FIG. 5, thus having a value ranged from 0 to 6.

Area decoder outputs, area division decoder outputs, logarithmic approximation data obtained through the logarithmic approximation of these two outputs, and minimum and maximum values of the true values of the absolute value data for which the logarithmic approximation data are outputted are as listed below:

| Area decoder output | Area division decoder output | | | Logarithmic approximation data (dB) | True value (minimum) (dB) | True value (maximum) (dB) |
|---|---|---|---|---|---|---|
| 15 | 1 | 1 | 1 | 0   | −.56   | 0.00   |
| 15 | 1 | 1 | 0 | −1  | −1.16  | −.56   |
| 15 | 1 | 0 | 1 | −2  | −1.86  | −1.16  |
| 15 | 1 | 0 | 0 | −2  | −2.50  | −1.80  |
| 15 | 0 | 1 | 1 | −3  | −3.25  | −2.50  |
| 15 | 0 | 1 | 0 | −4  | −4.08  | −3.25  |
| 15 | 0 | 0 | 1 | −5  | −5.00  | −4.08  |
| 15 | 0 | 0 | 0 | −6  | −6.02  | −5.00  |
| 14 | 1 | 1 | 1 | −6  | −6.58  | −6.02  |
| 14 | 1 | 1 | 0 | −7  | −7.18  | −6.58  |
| 14 | 1 | 0 | 1 | −8  | −7.82  | −7.18  |
| 14 | 1 | 0 | 0 | −8  | −8.52  | −7.82  |
| 14 | 0 | 1 | 1 | −9  | −9.27  | −8.52  |
| 14 | 0 | 1 | 0 | −10 | −10.10 | −9.28  |
| 14 | 0 | 0 | 1 | −11 | −11.02 | −10.10 |
| 14 | 0 | 0 | 0 | −12 | −12.04 | −11.02 |
| 13 | 1 | 1 | 1 | −12 | −12.60 | −12.04 |
| 13 | 1 | 1 | 0 | −13 | −13.20 | −12.60 |
| 13 | 1 | 0 | 1 | −14 | −13.84 | −13.20 |
| 13 | 1 | 0 | 0 | −14 | −14.54 | −13.85 |
| 13 | 0 | 1 | 1 | −15 | −15.30 | −14.54 |
| 13 | 0 | 1 | 0 | −16 | −16.12 | −15.30 |
| 13 | 0 | 0 | 1 | −17 | −17.04 | −16.13 |
| 13 | 0 | 0 | 0 | −18 | −18.06 | −17.04 |
| 12 | 1 | 1 | 1 | −18 | −18.62 | −18.06 |
| 12 | 1 | 1 | 0 | −19 | −19.22 | −18.62 |
| 12 | 1 | 0 | 1 | −20 | −19.87 | −19.22 |
| 12 | 1 | 0 | 0 | −20 | −20.56 | −19.87 |
| 12 | 0 | 1 | 1 | −21 | −21.32 | −20.56 |
| 12 | 0 | 1 | 0 | −22 | −22.14 | −21.32 |
| 12 | 0 | 0 | 1 | −23 | −23.06 | −22.15 |
| 12 | 0 | 0 | 0 | −24 | −24.08 | −23.06 |
| 11 | 1 | 1 | 1 | −24 | −24.64 | −24.09 |
| 11 | 1 | 1 | 0 | −25 | −25.24 | −24.65 |
| 11 | 1 | 0 | 1 | −26 | −25.89 | −25.25 |
| 11 | 1 | 0 | 0 | −26 | −26.58 | −25.89 |
| 11 | 0 | 1 | 1 | −27 | −27.34 | −26.59 |
| 11 | 0 | 1 | 0 | −28 | −28.16 | −27.34 |
| 11 | 0 | 0 | 1 | −29 | −29.08 | −28.17 |
| 11 | 0 | 0 | 0 | −30 | −30.10 | −29.09 |
| 10 | 1 | 1 | 1 | −30 | −30.66 | −30.11 |
| 10 | 1 | 1 | 0 | −31 | −31.26 | −30.67 |
| 10 | 1 | 0 | 1 | −32 | −31.91 | −31.27 |
| 10 | 1 | 0 | 0 | −32 | −32.60 | −31.92 |

-continued

| Area decoder output | Area division decoder output | | | Logarithmic approximation data (dB) | True value (minimum) (dB) | True value (maximum) (dB) |
|---|---|---|---|---|---|---|
| 10 | 0 | 1 | 1 | −33 | −33.36 | −32.61 |
| 10 | 0 | 1 | 0 | −34 | −34.19 | −33.37 |
| 10 | 0 | 0 | 1 | −35 | −35.10 | −34.20 |
| 10 | 0 | 0 | 0 | −36 | −36.12 | −35.12 |
| 9 | 1 | 1 | 1 | −36 | −36.68 | −36.14 |
| 9 | 1 | 1 | 0 | −37 | −37.28 | −36.70 |
| 9 | 1 | 0 | 1 | −38 | −37.93 | −37.30 |
| 9 | 1 | 0 | 0 | −38 | −38.62 | −37.95 |
| 9 | 0 | 1 | 1 | −39 | −39.38 | −38.64 |
| 9 | 0 | 1 | 0 | −40 | −40.21 | −39.40 |
| 9 | 0 | 0 | 1 | −41 | −41.12 | −40.23 |
| 9 | 0 | 0 | 0 | −42 | −42.14 | −41.15 |
| 8 | 1 | 1 | 1 | −42 | −42.70 | −42.18 |
| 8 | 1 | 1 | 0 | −43 | −43.30 | −42.74 |
| 8 | 1 | 0 | 1 | −44 | −43.95 | −43.34 |
| 8 | 1 | 0 | 0 | −44 | −44.64 | −43.99 |
| 8 | 0 | 1 | 1 | −45 | −45.40 | −44.69 |
| 8 | 0 | 1 | 0 | −46 | −46.23 | −45.45 |
| 8 | 0 | 0 | 1 | −47 | −47.14 | −46.28 |
| 8 | 0 | 0 | 0 | −48 | −48.16 | −47.20 |
| 7 | 1 | 1 | 1 | −48 | −48.73 | −48.23 |
| 7 | 1 | 1 | 0 | −49 | −49.32 | −48.80 |
| 7 | 1 | 0 | 1 | −50 | −49.97 | −49.40 |
| 7 | 1 | 0 | 0 | −50 | −50.66 | −50.05 |
| 7 | 0 | 1 | 1 | −51 | −51.42 | −50.75 |
| 7 | 0 | 1 | 0 | −52 | −52.25 | −51.52 |
| 7 | 0 | 0 | 1 | −53 | −53.16 | −52.36 |
| 7 | 0 | 0 | 0 | −54 | −54.19 | −53.28 |
| 6 | 1 | 1 | 1 | −54 | −54.75 | −54.32 |
| 6 | 1 | 1 | 0 | −55 | −55.34 | −54.89 |
| 6 | 1 | 0 | 1 | −56 | −55.99 | −55.50 |
| 6 | 1 | 0 | 0 | −56 | −56.68 | −56.16 |
| 6 | 0 | 1 | 1 | −57 | −57.44 | −56.87 |
| 6 | 0 | 1 | 0 | −58 | −58.27 | −57.64 |
| 6 | 0 | 0 | 1 | −59 | −59.18 | −58.49 |
| 6 | 0 | 0 | 0 | −60 | −60.21 | −59.43 |
| 5 | 1 | 1 | 1 | −60 | −66.77 | −60.48 |
| 5 | 1 | 1 | 0 | −61 | −61.37 | −61.06 |
| 5 | 1 | 0 | 1 | −62 | −62.01 | −61.68 |
| 5 | 1 | 0 | 0 | −62 | −62.70 | −62.35 |
| 5 | 0 | 1 | 1 | −63 | −63.46 | −63.07 |
| 5 | 0 | 1 | 0 | −64 | −64.29 | −63.86 |
| 5 | 0 | 0 | 1 | −65 | −65.20 | −64.73 |
| 5 | 0 | 0 | 0 | −66 | −66.23 | −65.70 |
| 4 | 1 | 1 | 1 | −66 | −66.79 | −66.79 |
| 4 | 1 | 1 | 0 | −67 | −67.39 | −67.39 |
| 4 | 1 | 0 | 1 | −68 | −68.03 | −68.03 |
| 4 | 1 | 0 | 0 | −68 | −68.73 | −68.73 |
| 4 | 0 | 1 | 1 | −69 | −69.48 | −69.48 |
| 4 | 0 | 1 | 0 | −70 | −70.31 | −70.31 |
| 4 | 0 | 0 | 1 | −71 | −71.22 | −71.22 |
| 4 | 0 | 0 | 0 | −72 | −72.25 | −72.25 |
| 3 | 1 | 1 | 0 | −73 | −73.41 | −73.41 |
| 3 | 1 | 0 | 0 | −74 | −74.75 | −74.75 |
| 3 | 0 | 1 | 0 | −76 | −76.33 | −76.33 |
| 3 | 0 | 0 | 0 | −78 | −78.27 | −78.27 |
| 2 | 1 | 0 | 0 | −80 | −80.77 | −80.77 |
| 2 | 0 | 0 | 0 | −84 | −84.29 | −84.29 |
| 1 | 0 | 0 | 0 | −90 | −90.31 | −90.31 |

Figure 6:
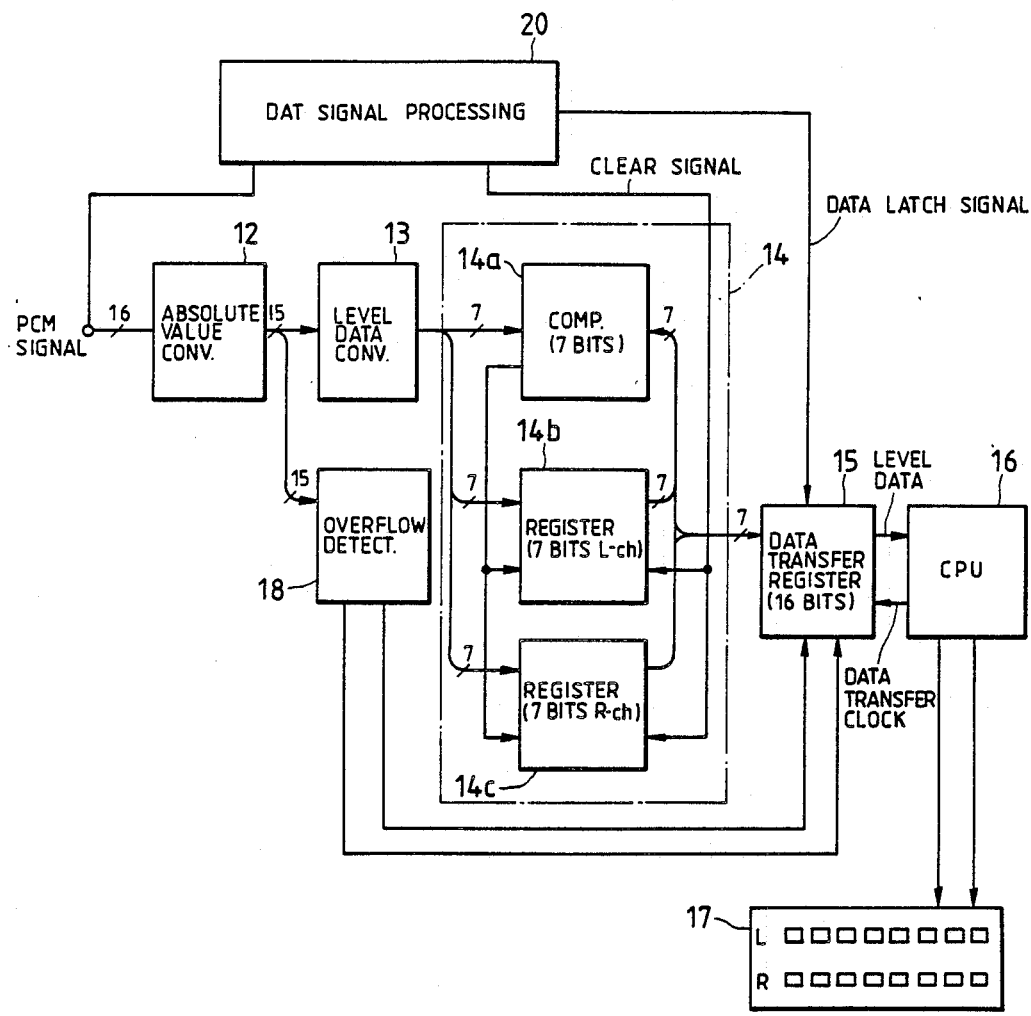
FIG. 6 is a block diagram showing another example of the digital level display unit.

In the above-described embodiment, a maximum value sampling period is determined by the CPU 16, however, as shown in FIG. 6, the maximum value sampling period may be set by a signal processing section 20 in a rotary head type digital audio tape deck (R-DAT). In this case, since the number of circuit elements to be time-controlled by the CPU 16 is reduced the burden on the CPU 16 is reduced, and the sampling time can be made constant.

Figure 7:
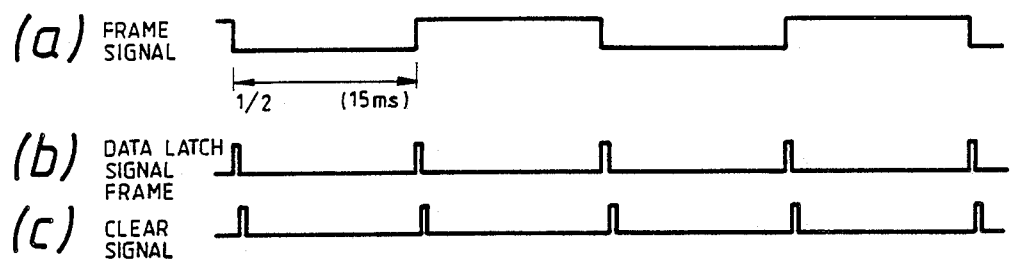
FIG. 7 is a timing chart for a description of the operation of the digital level display unit shown in FIG. 6.
Figure 8:
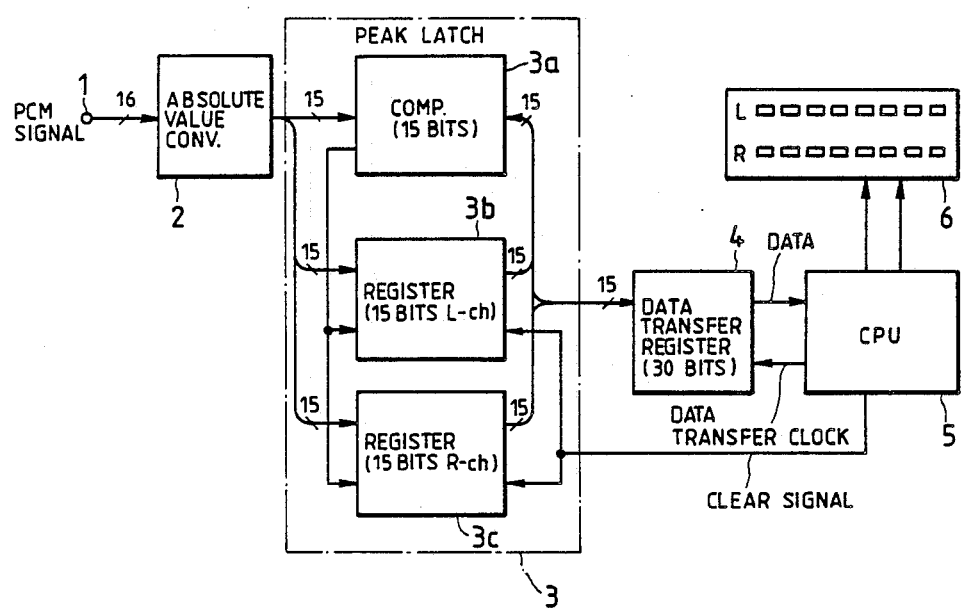
FIG. 8 is a block diagram showing a conventional digital level display unit.

This will become more apparent from FIGS. 7(a), 7(b) and 7(c). A frame signal shown in FIG. 7(a) is outputted every revolution of the rotary head cylinder, and has a cycle of 30 msec. A data latch signal shown in FIG. 7(b) is outputted at intervals of 15 msec in order to store in the data transferring register 15 the maximum value data held by the L-ch and R-ch registers 14b and 14c in the peak latch section 14. A clear signal shown in FIG. 7(c) is outputted to clear the L-ch and R-ch registers 14b and 14c in the peak latch section 14, immediately after the data latch signal.

As the signals are outputted in the above-described manner, the CPU 16 can read the signals within a ½ frame period, and therefore the CPU 16 can easily achieve the time control of the necessary circuit elements. In addition, the maximum value can be sampled for a predetermined period of time independently of the reading operation of the CPU 16.

As was described above, according to the invention, the digital data, after being converted into absolute value data, is compressed into data which has fewer bits. Therefore, the circuit scale can be reduced, and the data transferring time or the number of transferring lines can be decreased.

Furthermore, the output data is the largest of the data provided within a certain period of time, and therefore the data received can be utilized to suitably perform the level display of the digital data.

In the preferred embodiment, logarithmic approximation is carried out in compressing the data, and therefore it is unnecessary for the data receiving side to process the data, thus reducing the burden on the data receiving side.

Furthermore, with the aid of the data latch signal and clear signal provided every ½ frame by the signal processing section of the rotary head type digital audio tape deck (R-DAT) 20, the largest of the data provided within a ½ frame period is stored. Therefore, the time control can be easily achieved for a predetermined period of time.

What is claimed is:

1. A data outputting circuit comprising:
   absolute value conversion means for converting digital data into absolute value data, said digital data being input successively with a predetermined sampling period;
   data adjusting means including register means for comparing data corresponding to said absolute value data provided by said absolute value conversion means and storing the largest of said data corresponding to said absolute value data within a predetermined period of time; and
   transferring register means for receiving said data from said register means and transferring said data to a processing means every predetermined period of time; the improvement comprising:
   compression means included in said data adjusting means for compressing data into data with fewer bits;
   said compression means subjecting said absolute value data provided by said absolute value conversion means to logarithmic approximation and compressing said data applied from said absolute value conversion means to said transferring register means.

2. A data outputting circuit comprising:
   absolute value conversion means for converting digital data into absolute value data, said digital data being input successively with a predetermined sampling period;
   data adjusting means including register means for comparing data corresponding to said absolute value data provided by said absolute value conversion means and storing the largest of said data corresponding to said absolute value data within a predetermined period of time; and transferring register means for receiving said data from said register means and transferring said data to a processing means every predetermined period of time; the improvement comprising:

compression means included in said data adjusting means for compressing data into data with fewer bits; and an overflow detecting means for outputting an overflow signal to said transferring means when all of the bits of said absolute value data are detected to be at a high level;

said compression means compressing said absolute value data provided by said absolute value conversion means into data with fewer bits;

said register means storing the largest of said stored data provided by said compression means within a predetermined period of time; and said transferring register means receiving said data from said register means and transferring said data in synchronization with said predetermined period of time.

3. A data outputting circuit comprising:

absolute value conversion means for converting digital data into absolute value data, said digital data being input successively with a predetermined sampling period;

data adjusting means including register means for comparing data corresponding to said absolute value data provided by said absolute value conversion means and storing the largest of said data corresponding to said absolute value data within a predetermined period of time; and transferring register means for receiving said data from said register means and transferring said data to a processing means every predetermined period of time; the improvement comprising:

compression means included in said data adjusting means for compressing data into data with fewer bits;

said compression means compressing said data applied from said absolute value conversion means to said transferring register means; and said processing means applying a clear signal to said register means after said transferring register means receives said stored data from said register means.

4. A data outputting circuit as claimed in claim 3, wherein:

said compression means compresses said absolute value data provided by said absolute value conversion means into data with fewer bits;

said register means stores the largest of said stored data provided by said compression means within a predetermined period of time; and said transferring register means receives said data from said register means and transfers said data in synchronization with said predetermined period of time.

5. A data outputting circuit comprising:

absolute value conversion means for converting digital data input successively with a predetermined sampling period into absolute value data;

compressing means for compressing said absolute value data provided by said absolute value conversion means into data with fewer bits;

register means for storing the largest of said data provided by said compressing means within a predetermined period of time;

transferring register means for receiving said data from said register means and transferring said data to a processing means in synchronization with said predetermined period of time; and signal generating means for applying, in synchronization with said predetermined period of time, a data latch signal to said transferring register means to allow said transferring register means to latch said data stored in said register means, and a clear signal to said register means immediately after the application of said data latch signal to clear said data stored in said register means.

6. A data outputting circuit as claimed in claim 5, in which said signal generating means is a signal processing section in a rotary head type digital audio tape deck (R-DAT) which outputs said data latch signal and said clear signal every ½ frame in said rotary head type digital audio tape deck.

7. A data outputting circuit as claimed in claim 5, in which said compressing means comprises means for subjecting said absolute value data provided by said absolute value conversion means to logarithmic approximation.

8. A data outputting circuit as claimed in claim 5, further comprising: an overflow detecting means for outputting an overflow signal to said transferring means when all of the bits of said absolute value data are detected to be at a high level.

* * * * *